(12) United States Patent
Simonson et al.

(10) Patent No.: US 9,671,465 B2
(45) Date of Patent: Jun. 6, 2017

(54) DETECTING FAULTS IN HOT-SWAP APPLICATIONS

(71) Applicant: LINEAR TECHNOLOGY CORPORATION, Milpitas, CA (US)

(72) Inventors: Joshua John Simonson, Sunol, CA (US); Christopher Bruce Umminger, Mountain View, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 441 days.

(21) Appl. No.: 14/301,043

(22) Filed: Jun. 10, 2014

(65) Prior Publication Data

US 2015/0015300 A1    Jan. 15, 2015

Related U.S. Application Data

(60) Provisional application No. 61/845,502, filed on Jul. 12, 2013.

(51) Int. Cl.
*G01R 31/02* (2006.01)
*G01R 31/327* (2006.01)
(Continued)

(52) U.S. Cl.
CPC ....... *G01R 31/327* (2013.01); *G01R 31/2621* (2013.01); *H03K 17/0822* (2013.01); *H03K 17/18* (2013.01)

(58) Field of Classification Search
CPC .... G01R 31/025; G01R 31/021; G01R 31/40; G01R 31/30; H01L 2224/13; H01L 2924/01033
(Continued)

(56) References Cited

U.S. PATENT DOCUMENTS 5,847,554 A * 12/1998 Wilcox ............... H02M 3/1588
                                                          323/282
6,185,488 B1    2/2001 Nomoto
(Continued)

FOREIGN PATENT DOCUMENTS

DE    10 2005 055954 A1    5/2007

OTHER PUBLICATIONS

European Patent Office (EPO). 2014. Extended European Search Report dated Dec. 23, 2014, for European Patent Application 14002300.3-1560, Linear Technology Corporation, applicant, entitled "Detecting Faults in Hot-Swap Applications" (European counterpart to instant application).
(Continued)

*Primary Examiner* — Melissa Koval
*Assistant Examiner* — Trung Nguyen
(74) *Attorney, Agent, or Firm* — McDermott Will & Emery LLP

(57) ABSTRACT

Circuitry for detecting faults in a system for supplying power from an input node to an output node and having at least one switch coupled between the input node and the output node. The fault detecting circuitry is configured for indicating a fault condition of the switch when the switch is commanded to turn on and at least one of the following conditions is detected: a voltage across the switch exceeds a predetermined value or a value of the switch control signal is insufficient to turn the switch on. The fault condition is indicated only if the detected condition is present for a predetermined period of time.

15 Claims, 3 Drawing Sheets

(51) Int. Cl.
*G01R 31/26* (2014.01)
*H03K 17/18* (2006.01)
*H03K 17/082* (2006.01)

(58) Field of Classification Search
USPC ................ 324/762.01–762.09, 500, 764.01, 324/538–544, 509, 512, 528, 531
See application file for complete search history.

(56) References Cited

U.S. PATENT DOCUMENTS 7,839,201 B2 † 11/2010 Jacobson
2006/0132142 A1 6/2006 Kabasawa
2006/0227478 A1* 10/2006 Herr .................. H03K 17/0822
361/93.1
2015/0016005 A1 † 1/2015 Simonson

OTHER PUBLICATIONS

LTC4355, "Positive High Voltage Ideal Diode-OR with Input Supply and Fuse Monitors", Linear Technology, 20 pgs. http://cds.linear.com/docs/en/datasheet/4355ff.pdf downloaded Jun. 10, 2014.
LTC4354, "Negative Voltage Diode-OR Controller and Monitor", Linear Technology, 14 pgs. http://cds.linear.com/docs/en/datasheet/4354fc.pdf Downloaded Jun. 10, 2014.

* cited by examiner
† cited by third party

DETECTING FAULTS IN HOT-SWAP APPLICATIONS

This application claims priority of U.S. provisional patent application No. 61/845,502 entitled "DETECTING FAULTS IN HOT-SWAP APPLICATIONS," filed on Jul. 12, 2013 and incorporated herein by reference

TECHNICAL FIELD

This disclosure relates generally to protecting switches in electrical systems, and in particular, to detecting faults in current limited systems that can cause excessive heating in a switch.

BACKGROUND ART

A hot-swap circuit applies power from an input source to a load in a controlled and protected fashion. One function of such a controller is to limit inrush currents from the power source to the load, especially load capacitance, when power is first applied or if the power source voltage suddenly increases. Another function is to limit current if the load attempts to draw too much current, for example if there is a short circuit in the load.

FIG. 1 shows a conventional hot-swap circuit having an input node VIN for receiving power from a power source, and an output node Vout coupled to a load. A single MOSFET 100 is coupled in series with a current sense resistor 102 between the input node VIN and the output node VOUT. The hot swap circuit also has control circuitry including a voltage source 104, a current limit amplifier 106, a current source 108 and a transistor 110.

Numerous such circuits are commercially available. When limiting current, a current limit amplifier 106 compares a voltage representing the current in the current sense resistor 102 with a voltage VLIMIT produced by the voltage source 104 to control the gate of the MOSFET 100 so as to reduce the current flowing through the MOSFET 100 when the sensed current exceeds a maximum value established by the voltage VLIMIT. The current limit amplifier 104 adjusts the gate to source voltage of the MOSFET 100 in order to limit the voltage across the current sense resistor 102 and thus the current through the MOSFET 100. The current source 108 is provided for pulling up the gate voltage. A transistor 110 is provided for supplying the MOSFET 100 with ON and OFF signals to command the MOSFET 100 to turn on or off, respectively.

During a current limit operation, the voltage and current through the MOSFET 100 can both be large, resulting in high power dissipation in the MOSFET 100. If this power dissipation persists, the MOSFET 100 can reach temperatures that cause damage. MOSFET manufacturers present the safe limits on MOSFET voltage, current, and time as a curve referred to as Safe Operating Area (SOA). Commonly, a timer circuit 112 sets a maximum time period during which the MOSFET 100 is allowed to operate in a current limit mode.

The timer circuit 112 may be coupled to the current limit amplifier 106 for receiving a signal indicating that the current limit operation is initiated. When the time period set by the timer circuit 112 expires, an overcurrent fault signal is produced, and the MOSFET 100 may be turned off to protect it from overheating. The load will lose power and the hot swap controller will indicate that a fault has occurred.

Often high power hot-swap applications need to charge large bypass capacitors 126 ($C_L$) across the load. To reduce stress on the MOSFET 100, the load may be kept off until the bypass capacitors 126 are charged. A small charging current for the capacitance keeps the power in the MOSFET 100 low enough to prevent a dangerous rise in temperature. The gate voltage may be pulled up by a current from the current source 108 commonly in the range of 10-50 µA.

Hot swap controllers also commonly generate a signal to indicate that power is good and the load can safely draw current. For example, a power good signal may be produced by a comparator that monitors the output voltage. Power is considered good when the output voltage has risen above a threshold. The output voltage may be used as the condition for indicating that the power is good.

Also, a power good signal may be produced by monitoring the switch turn-on control signal. For a MOSFET switch 100 this is the gate to source voltage. If it is significantly above the MOSFET threshold voltage, then the MOSFET channel is fully on and load current may flow through it. However, this gate to source voltage may be reduced during brief episodes of current limit during normal operation. In such situations, the output power still may be considered good. Thus, the signal indicating that the gate to source voltage has exceeded a threshold is latched. This latched signal is used to indicate that the MOSFET has turned fully on and the load may be turned on. The latched signal will continue to indicate that power is good even if the gate voltage is subsequently reduced during short duration current limiting events. The latch is reset if the MOSFET is ever turned off.

Further, a power good signal may be produced by monitoring a voltage between drain and source of the MOSFET 100. Once this voltage has gone below a threshold, then the MOSFET 100 is assumed to be fully on and load current may flow through it. However, the voltage between drain and source may also increase during normal operation, for example if the input voltage increases quickly. In such situations, output power still may be considered good. Thus, the signal indicating that the voltage between drain and source is below a threshold can also be latched. This latched signal can be used to indicate that the MOSFET 100 has turned fully on and the load may be turned on.

In a hot-swap application, several things can prevent the MOSFETs from turning on with low impedance. A damaged MOSFET may have leakage from gate to drain or have degraded drain to source on-resistance RDS(ON). Debris on the board may also produce leakage or a short from the gate pin to the source pin, the MOSFET drain, or to ground. In these conditions the hot-swap controller may not be able to pull the gate pin high enough to fully enhance the MOSFET, or the MOSFET may not reach the intended on-resistance when the gate pin is fully enhanced. This can put the MOSFET in a condition where the power in the MOSFET is higher than its continuous power capability, even though the current is below the current limit.

Conventional methods determine that the MOSFET has fully turned on by monitoring gate to drain or gate to source voltage. That information is then latched. However, if the MOSFET subsequently degrades in performance, the latched information will not be updated to indicate that a problem has developed.

SUMMARY OF THE DISCLOSURE

The present disclosure presents circuitry for detecting faults in a system for supplying power from an input node to an output node and having at least one switch coupled between the input node and the output node and controlled by a switch control signal for performing switching operations to provide power from the input node to the output node. The switch is supplied with an ON signal to command the switch to turn on. Current limit circuitry may be configured for controlling the switch so as to limit a value of current flowing through the switch.

The fault detecting circuitry is configured for indicating a fault condition of the switch when the switch is commanded to turn on and at least one of the following conditions is detected:

voltage across the switch exceeds a predetermined value or a value of the switch control signal is insufficient to turn the switch on.

The fault condition is indicated only if the detected condition is present for a predetermined period of time.

For example, the switch may include a MOSFET and the fault detecting circuit may be configured for indicating the fault condition when the MOSFET is commanded to turn on and a voltage between drain and source of the MOSFET is greater than a first threshold value for a first predetermined period of time.

Alternatively, the fault condition may be indicated when the MOSFET is commanded to turn on and a gate to source voltage of the MOSFET is below a second threshold value for a second predetermined period of time.

In an exemplary embodiment, multiple switches may be coupled in parallel between the input node and the output node.

The fault detecting circuitry may be configured for indicating the fault condition when the switches are commanded to turn on and switch control signals for all of the switches are insufficient to turn the switches on.

Also, the fault condition may be indicated when the switches are commanded to turn on and the switch control signal for any one of the switches is insufficient to turn the switch on.

Further, the fault condition may be indicated when the switch is commanded to turn on, the switch control signal for the switch is insufficient to turn the switch on, and an output signal of the switch is not being regulated.

For example, multiple MOSFET switches may be coupled in parallel between the input and output nodes.

The fault detecting circuit may be configured for indicating the fault condition when the MOSFET switches are commanded to turn on and gate to source voltages of all of the MOSFET switches are below a threshold value for a predetermined period of time.

Also, the fault condition may be indicated when the MOSFET switches are commanded to turn on and a gate to source voltage of any one of the MOSFET switches is below a threshold value for a predetermined period of time.

Further, the fault condition may be indicated when the MOSFET switches are commanded to turn on, and a gate to source voltage of one of the MOSFET switches is below a threshold value and an output signal of the MOSFET switch is not being regulated.

For example, the fault detecting circuit may be configured for detecting MOSFET faults in a hot swap controller.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

The present disclosure will be made using specific examples of hot-swap controllers presented in FIGS. 2 and 3. However, the disclosure is applicable to any switching circuits for supplying power to a load.

Figure 1:
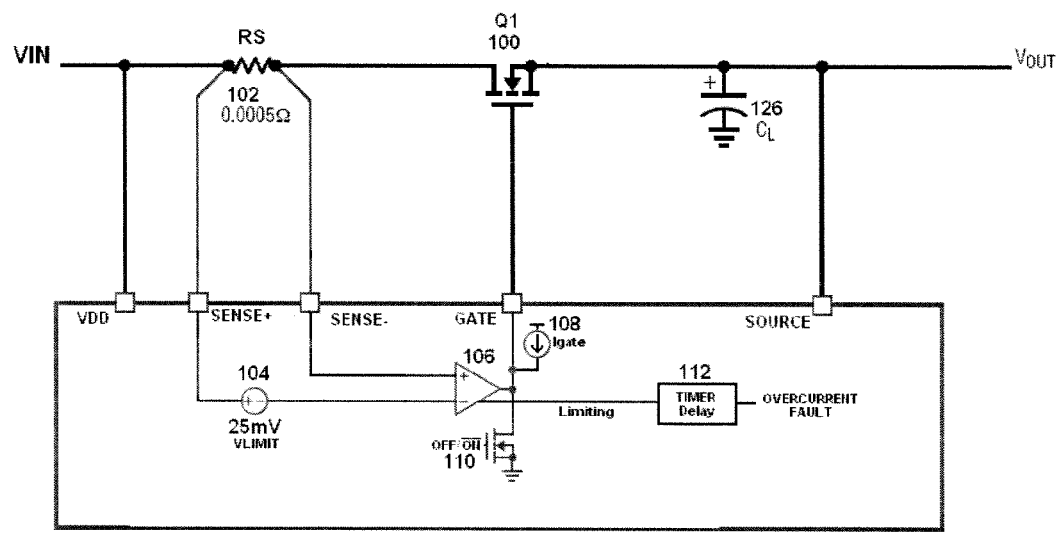
FIG. 1 illustrates a conventional hot-swap controller.
Figure 2:
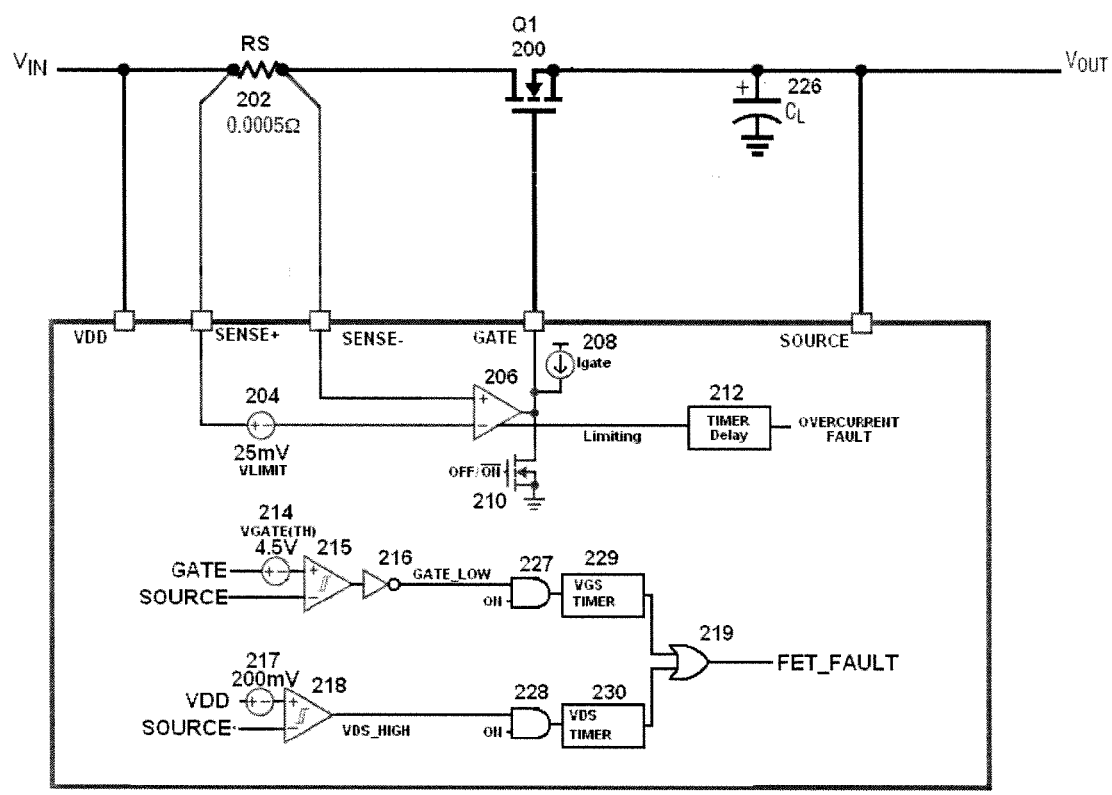
FIGS. 2 and 3 show exemplary embodiments of hot-swap controllers in accordance with the present disclosure.

FIG. 2 illustrates a hot-swap controller having an input node VIN for receiving power from a power source, and an output node Vout coupled to a load. A single MOSFET 200 is coupled in series with a current sense resistor 202 between the input node VIN and the output node VOUT. The hot swap circuit also has control circuitry including a voltage source 204, a current limit amplifier 206, a current source 208 and a transistor 210. These elements may be similar to the respective elements in FIG. 1. A bypass capacitor 226 may be provided across the load.

The hot swap circuit may also include a voltage source 214, a hysteresis comparator 215, an inverter 216, a voltage source 217, a hysteresis comparator 218, an OR gate 219, AND gates 227, 228 and timer circuits 229 and 230. In particular, a pair of comparators 215 and 218 monitors two conditions that could be present in a malfunctioning MOSFET switch 200. A FET fault signal is generated if either of these fault conditions occurs and persists.

The first fault condition is excessive voltage between the MOSFET drain and source. For example, MOSFET or board damage could cause the MOSFET to fail to reach the expected on-resistance when the gate pin is fully enhanced. The comparator 218 monitors the drain voltage VDD and the source voltage of the MOSFET 200 to compare a voltage between drain and source (VDS) of the MOSFET with a threshold voltage, such as 200 mV, set by the voltage source 217.

When the VDS is greater than the threshold voltage, a VDS_HIGH signal is asserted at the output of the comparator 218. This signal is supplied to an input of the AND gate 228. The second input of the AND gate 228 is provided with the ON signal used to turn on the MOSFET 200. The output signal of the AND gate 228 initiates the VDS timer 230 that provides a pre-set time delay period, after expiration of which a FET_FAULT signal is produced by the OR gate 219 to set a MOSFET fault condition. Hence, the first MOSFET fault condition indicates that the VDS exceeds the threshold for a time period greater than the pre-set time delay period.

The time delay provided by the VDS timer 230 is required because there are normal situations, such as startup, where the VDS exceeds the threshold voltage until the MOSFET gate has reached its final voltage. These situations are transient in nature, during which the MOSFET is dissipating power. They become a fault only if the power dissipation lasts too long. The time delay period of the VDS timer is set to be longer than these normal transient operating conditions.

The second fault condition is insufficient gate-source voltage (VGS) of the MOSFET 200, i.e. a value of a switch control signal is insufficient to turn the MOSFET switch on. Debris on the board or a damaged MOSFET may result in gate leakage that reduces the gate-source voltage and raises the on-resistance. The output voltage may be high enough to appear normal even though the on-resistance is too high. Severely damaged MOSFETs can have gate, drain and source all shorted together. In this case, the MOSFET will be unable to turn off if the channel is shorted.

To detect this type of fault, the comparator 215 monitors the gate to source voltage (VGS) with respect to a threshold voltage from the voltage source 217 selected well above the MOSFET threshold. For example, the threshold voltage may be set at 4.5V. When the gate to source voltage is below this threshold voltage, a GATE_LOW signal is asserted at the output of the inverter 216. This signal is supplied to an input of the AND gate 227. The second input of the AND gate 227 is provided with the ON signal used to turn on the MOSFET 200. The output signal of the AND gate 227 initiates the VGS timer 229 that provides a pre-set time delay period, after expiration of which a FET_FAULT signal is produced by the OR gate 219 to set the second MOSFET fault condition. This MOSFET fault condition indicates that the gate to source voltage of the MOSFET 200 is below the threshold for a period of time greater that the time delay period of the VGS timer 229.

The time delay provided by a VGS timer 229 is required because there are normal situations where the gate to source voltage is below the threshold. These situations are transient in nature, such as startup or during current limiting, where the gate to source voltage is low and the MOSFET is dissipating power. They become a fault only if the power dissipation lasts too long. The time delay period established by the VGS timer 229 is set to be longer than these normal transient operating conditions.

Figure 3:
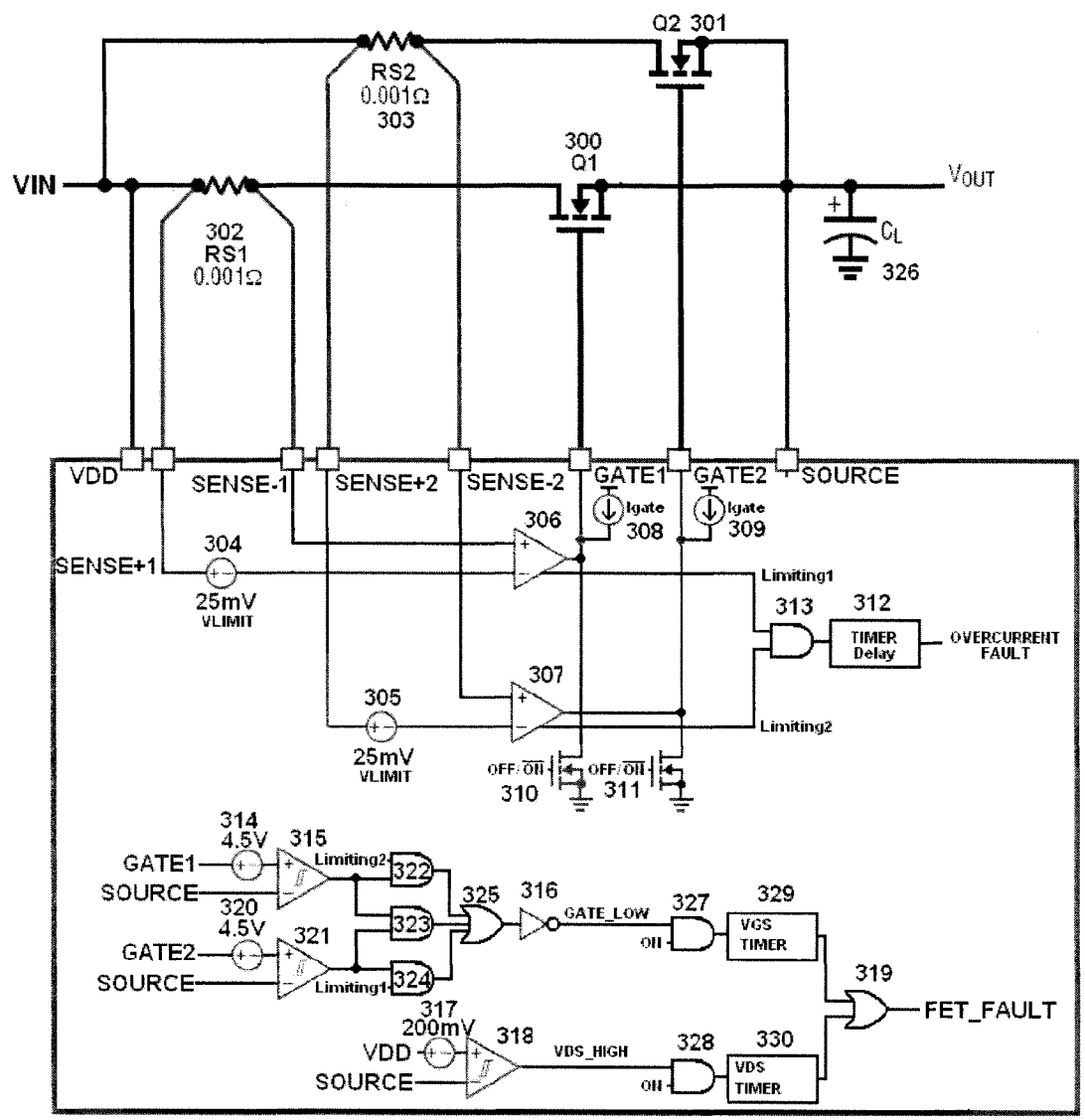

When using multiple MOSFETs, a MOSFET fault is set if at least one of the MOSFETS has a low gate to source voltage and is not in current limit, as shown in FIG. 3 which presents an exemplary hot-swap controller with multiple MOSFETS 300, 301.

Each MOSFET 300 and 301 is independently controlled using the respective current sense resistor 302 and 303, and the respective current limit amplifier 306 and 307. The current sense resistor 302 is coupled between positive node SENSE+1 and negative node SENSE−1 representing the MOSFET 300, and the current sense resistor 303 is coupled between positive node SENSE+2 and negative node SENSE−2 representing the MOSFET 301. Each of the current limit amplifiers 306 and 307 independently from the other amplifier controls the gate of the respective MOSFET 300 and 301 so as to limit current flowing through the MOSFETs 300 and 301 when the current sensed in the respective resistors 302 and 303 exceeds the maximum current value defined by the VLIMIT voltage provided by respective voltage sources 304 and 305. Current sources 308 and 309 provide current to pull up the gate voltage of the MOSFETs 300 and 301, respectively. Transistors 310 and 311 are provided for supplying the respective MOSFETs 300 and 301 with ON and OFF signals to command the MOSFETs 300 and 301 to turn on or off, respectively.

Signals LIMITING 1 and LIMITING 2 respectively produced at status pins of the current limit amplifiers 306 and 307 indicate that the respective MOSFETs 300 and 301 are limiting the current flowing through them. These signals are supplied to respective inputs of an AND gate 313 that produces an output signal supplied to a timer 312 that sets a delay period for indicating an overcurrent fault condition.

When MOSFETs 300 and 301 are limiting the current, the gate control provided by the current limit amplifiers 304 and 305 divides the current and stress evenly between the MOSFETs 300 and 302 despite any mismatch in their threshold voltages or temperatures.

When the load current increases to a point where both MOSFETs 300 and 301 have begun limiting current, the VDS and the dissipated power begin to increase, requiring the MOSFETS to be shut off for protection. Due to the AND gate 313, the timer 312 is initiated only when both LIMITING 1 and LIMITING 2 signals are produced, i.e. when both of the MOSFETs 300 and 301 are operating to limit the current. When the delay period established by the timer 312 expires, an overcurrent fault signal is produced to indicate that both MOSFETs 300 and 301 should be turned OFF.

The hot swap controller in FIG. 3 further includes circuitry for detecting fault conditions of MOSFETs 300 and 301. This circuitry includes a voltage source 314, a hysteresis comparator 315, an inverter 316, a voltage source 317, a hysteresis comparator 318, an OR gate 319, a voltage source 320, a hysteresis comparator 321, AND gates 322, 323 and 324, an OR gate 325, AND gates 327, 328 and timer circuits 329 and 330. Similar to the circuitry in FIG. 2, the fault detecting circuitry in FIG. 3 monitors two conditions that could be present in malfunctioning MOSFETs 300 and 301. A FET fault signal is generated if either of these fault conditions occurs and persists.

The comparator 318 monitors excessive voltage between the drain and source of the MOSFETs 300 and 301 connected in parallel. In particular, the comparator 318 compares the VDS of the MOSFETs 300 and 301 with a threshold voltage, such as 200 mV, set by the voltage source 317.

When the VDS is greater than the threshold voltage, a VDS_HIGH signal is asserted at the output of the comparator 318. This signal is supplied to an input of the AND gate 328. The second input of the AND gate 328 is provided with the ON signal used to turn on the MOSFET 300 and 301. The output signal of the AND gate 328 initiates the VDS timer 330 that provides a pre-set time delay period, after expiration of which a FET_FAULT signal is produced by the OR gate 319 to set a MOSFET fault condition. Hence, the first MOSFET fault condition indicates that the VDS exceeds the threshold for a time period greater than the pre-set time delay period.

The comparators 315 and 321 detect insufficient gate-source voltage (VGS) of the MOSFETs 300 and 301, respectively. In particular, the comparators 315 and 321 monitor the gate to source voltage (VGS) of the respective MOSFETs 300 and 301 with respect to threshold voltages from the respective voltage sources 314 and 320 selected well above the MOSFET threshold, for example, at 4.5V. When the gate to source voltage of the respective MOSFET 300 or 301 is below the threshold voltage, a signal asserted at the output of the respective comparator 315 or 321 is supplied to an input of the respective AND gate 322 or 324. Also, the output signals of the comparators 315 and 321 are provided at the inputs of the AND gate 323.

The second input of the AND gate 324 is supplied with the LIMITING 1 signal indicating that the MOSFET 300 limiting current, whereas the second input of the AND gate 322 is supplied with the LIMITING 2 signal indicating that the MOSFET 301 limiting current. The output signal of any of the AND gates 322, 323 and 324 passing through the OR gate 325 causes the GATE_LOW signal at the output of the inverter 316 which is supplied to an input of the AND gate 327. The other input of the AND gate 327 is provided with the ON signal used to turn on the MOSFET 300 and 301.

The output signal of the AND gate 328 initiates the VGS timer 329 that provides a pre-set time delay period, after expiration of which a FET_FAULT signal is produced by the OR gate 319 to set the second MOSFET fault condition. This MOSFET fault condition indicates that the gate to source voltage of the MOSFET 300 or 301 is below the threshold for a period of time greater that the time delay period of the VGS timer 329.

When the FET_FAULT is set, the hot swap controller or the system can take protective action. For example, the hot-swap controller can turn off all MOSFETs to shut off load power. In the case of a gate to drain short, it may be impossible for the hot-swap controller to turn off one or more MOSFETs. However, the MOSFET fault signal can be used to put the load into a low-current state, shut down upstream supplies, and/or flag the system for service.

Hence, the MOSFET fault detection circuitry of the present disclosure may provide:

indication of a MOSFET fault when the MOSFET is commanded ON and the VDS is greater than a threshold for a pre-set period of time;

indication of a MOSFET fault when the MOSFET is commanded ON and the gate to source voltage VGS of all MOSFETs or any one of the MOSFETs is below a threshold for a pre-set period of time, i.e. the gate control signals for all switches or any switch are insufficient to turn the switches on, and/or indication of a switch fault in a system with parallel switches if at least one MOSFET is both not limiting current and has a low gate to source voltage VGS, i.e. the gate control signal of at least one of the MOSFETs is insufficient to turn the respective MOSFET on and is not being actively regulated.

Although MOSFET fault detection for two MOSFETs are shown in FIG. 3, this configuration can be extended to detecting fault conditions for any number of MOSFETs arranged in parallel.

Also, the fault detection circuitry of the present disclosure may use either one or both of the fault criteria discussed above.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

For example, the VDS could be measured with or without the current sense resistors. The VDS and VGS timers could be provided before or after the OR gate 219 or 319.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

What is claimed is:

1. A system for supplying power from an input node to an output node comprising:

at least one switch coupled between the input node and the output node and controlled by a switch control signal for performing switching operations to provide power from the input node to the output node, the switch being supplied with an ON signal to command the switch to turn on, fault detecting circuitry for indicating a fault condition of the switch when the switch is commanded to turn on and at least one of the following conditions is detected:

a voltage across the switch exceeds a predetermined value or a value of the switch control signal is insufficient to turn the switch on, or the fault condition being indicated only if the detected condition is present for a predetermined period of time; and wherein at least one of the following:

multiple switches are coupled in parallel between the input node and the output node; and at least one of the following:

the fault detecting circuitry is configured for indicating the fault condition when the switches are commanded to turn on and switch control signals for all of the switches are insufficient to turn the switches on; or the fault detecting circuitry is configured for indicating the fault condition when the switches are commanded to turn on and the switch control signal for any one of the switches is insufficient to turn the switch on; or the fault detecting circuitry is configured for indicating the fault condition when the switch is commanded to turn on, the switch control signal for the switch is insufficient to turn the switch on, and an output signal of the switch is not being regulated; or the switch includes a MOSFET and the fault detecting circuit is configured for indicating the fault condition when the MOSFET is commanded to turn on and a voltage between drain and source of the MOSFET is greater than a first threshold value for a first predetermined period of time; or the switch includes a MOSFET and the fault detecting circuit is configured for indicating the fault condition when the MOSFET is commanded to turn on and a gate to source voltage of the MOSFET is below a second threshold value for a second predetermined period of time; or multiple MOSFET switches are coupled between the input and output nodes; and wherein the fault detecting circuit is configured for indicating the fault condition when the MOSFET switches are commanded to turn on and gate to source voltages of all of the MOSFET switches are below a threshold value for a predetermined period of time.

2. The system of claim 1, wherein multiple switches are coupled in parallel between the input node and the output node.

3. The system of claim 2, wherein the fault detecting circuitry is configured for indicating the fault condition when the switches are commanded to turn on and switch control signals for all of the switches are insufficient to turn the switches on.

4. The system of claim 2, wherein the fault detecting circuitry is configured for indicating the fault condition when the switches are commanded to turn on and the switch control signal for any one of the switches is insufficient to turn the switch on.

5. The system of claim 1, wherein the fault detecting circuitry is configured for indicating the fault condition when the switch is commanded to turn on, the switch control signal for the switch is insufficient to turn the switch on, and an output signal of the switch is not being regulated.

6. The system of claim 1, wherein the switch includes a MOSFET and the fault detecting circuit is configured for indicating the fault condition when the MOSFET is commanded to turn on and a voltage between drain and source of the MOSFET is greater than a first threshold value for a first predetermined period of time.

7. The system of claim 1, wherein the switch includes a MOSFET and the fault detecting circuit is configured for indicating the fault condition when the MOSFET is commanded to turn on and a gate to source voltage of the MOSFET is below a second threshold value for a second predetermined period of time.

8. The system of claim 1, wherein multiple MOSFET switches are coupled between the input and output nodes.

9. The system of claim 8, wherein the fault detecting circuit is configured for indicating the fault condition when the MOSFET switches are commanded to turn on and gate to source voltages of all of the MOSFET switches are below a threshold value for a predetermined period of time.

10. The system of claim 8, wherein the fault detecting circuitry is configured for indicating the fault condition when the MOSFET switches are commanded to turn on and a gate to source voltage of any one of the MOSFET switches is below a threshold value for a predetermined period of time.

11. The system of claim 8, wherein the fault detecting circuitry is configured for indicating the fault condition when the MOSFET switches are commanded to turn on, and a gate to source voltage of a MOSFET switch is below a threshold value and an output signal of the MOSFET switch is not being regulated.

12. A circuit for detecting a fault condition in a system for supplying power from an input node to an output node and having one or more MOSFET switches coupled between the input node and the output node, the circuit being configured for indicating a MOSFET fault condition when the MOSFET is commanded to turn on and a voltage between drain and source of the MOSFET is greater than a first threshold value for a first predetermined period of time, or when the MOSFET is commanded to turn on and a gate to source voltage of the MOSFET is below a second threshold value for a second predetermined period of time, wherein multiple MOSFET switches are arranged in parallel between the input node and the output node, and wherein at least one of the following:

the MOSFET fault condition is indicated when the MOSFET switches are commanded to turn on and gate to source voltages of all of the MOSFET switches are below the second threshold value for the second predetermined period of time; or the MOSFET fault condition is indicated when the MOSFET switches are commanded to turn on and a gate to source voltage of any one of the MOSFET switches is below the second threshold value for the second predetermined period of time; or the MOSFET fault condition is indicated when the MOSFET switches are commanded to turn on, and a gate to source voltage of a MOSFET switch is below the second threshold value and an output signal of the MOSFET switch is not being regulated.

13. The circuit of claim 12, wherein the MOSFET fault condition is indicated when the MOSFET switches are commanded to turn on and gate to source voltages of all of the MOSFET switches are below the second threshold value for the second predetermined period of time.

14. The circuit of claim 12, wherein the MOSFET fault condition is indicated when the MOSFET switches are commanded to turn on and a gate to source voltage of any one of the MOSFET switches is below the second threshold value for the second predetermined period of time.

15. The circuit of claim 12, wherein the MOSFET fault condition is indicated when the MOSFET switches are commanded to turn on, and a gate to source voltage of a MOSFET switch is below the second threshold value and an output signal of the MOSFET switch is not being regulated.

* * * * *